(12) United States Patent
Suh

(10) Patent No.: US 10,741,424 B2
(45) Date of Patent: Aug. 11, 2020

(54) SEMICONDUCTOR PROCESSING DEVICE EQUIPPED WITH PROCESS CHAMBER

(71) Applicants: Allied TechFinders Co., Ltd., Suwon-si (KR); Kee Won Suh, Busan (KR)

(72) Inventor: Kee Won Suh, Busan (KR)

(73) Assignees: ALLIED TECHFINDERS CO., LTD, Suwon-si (KR); Kee Won Suh, Busan (KR)

( * ) Notice: Subject to any disclaimer, the term of this patent is extended or adjusted under 35 U.S.C. 154(b) by 81 days.

(21) Appl. No.: 15/942,800

(22) Filed: Apr. 2, 2018

(65) Prior Publication Data

US 2018/0294173 A1 Oct. 11, 2018

(30) Foreign Application Priority Data

Mar. 31, 2017 (KR) .................. 10-2017-0041458

(51) Int. Cl.
*H01J 37/32* (2006.01)
*H01L 21/67* (2006.01)

(52) U.S. Cl.
CPC .. *H01L 21/67069* (2013.01); *H01J 37/32458* (2013.01); *H01J 37/32715* (2013.01); *H01J 37/32743* (2013.01); *H01J 37/32899* (2013.01); *H01L 21/6719* (2013.01); *H01L 21/67126* (2013.01); *H01J 2237/334* (2013.01)

(58) Field of Classification Search
CPC ........... H01L 21/67069; H01L 21/6719; H01L 21/67126; H01L 21/683; H01L 21/67772; H01L 21/67742; H01L 21/67739; H01L 21/67184; H01L 21/3065; H01J 37/32458; H01J 37/32899; H01J 37/32743; H01J 37/32715; H01J 2237/334
USPC ....................................... 118/715; 156/345.1
See application file for complete search history.

(56) References Cited

U.S. PATENT DOCUMENTS

2003/0196760 A1* 10/2003 Tyler ................. H01J 37/32082
156/345.47
2005/0139160 A1* 6/2005 Lei ...................... C23C 16/4412
118/715

FOREIGN PATENT DOCUMENTS

KR 10-1841034 B1 3/2018

* cited by examiner

*Primary Examiner* — Rudy Zervigon
(74) *Attorney, Agent, or Firm* — The PL Law Group, PLLC

(57) ABSTRACT

A semiconductor processing device according to the present invention includes a process chamber having an inner space in which plasma is generated and a chuck unit disposed in the inner space and supporting a substrate processed by the plasma. The process chamber includes a first chamber portion and a second chamber portion that are opened from each other, and when the first chamber portion and the second chamber portion are closed together, the process chamber is provided with the inner space in which the plasma is generated. When the first chamber portion and the second chamber portion are opened from each other, the chuck unit is exposed to outside.

13 Claims, 7 Drawing Sheets

SEMICONDUCTOR PROCESSING DEVICE EQUIPPED WITH PROCESS CHAMBER

CROSS REFERENCE TO RELATED APPLICATION

The present application claims priority to Korean Patent Application NO. 10-2017-0041458, filed Mar. 31, 2017, the entire contents of which is incorporated herein for all purposes by this reference.

BACKGROUND OF THE INVENTION

Field of the Invention

The present invention relates generally to a semiconductor processing device equipped with a standardized process chamber having a vacuum chamber in which a semiconductor substrate such as a wafer is processed.

Description of the Related Art

A semiconductor processing device for a surface treatment for forming a fine pattern on the surface of a semiconductor wafer includes a photolithography device that forms a pattern designed on a mask, an etching device that removes a patterned thin film on the wafer, and a deposition device that deposits a pattern thin film on the wafer.

Even though the process steps are different, semiconductor processing devices have common features such as a chamber that processes wafers, a vacuum module that provides a vacuum in the chamber, a chuck module that supports the wafer loaded in the chamber, a frame module that supports the respective modules, a gas supply module that supplies gas into the vacuum chamber, and an energy source module that generates plasma or microwave which is energy for etching or deposition.

Such semiconductor processing devices have been developed by Tokyo Electron (TEL) in Japan, Lam Research Corporation (LRC) in the US, Applied Materials (AMT) in the US, and the like.

Each company's system has unique characteristics and a characteristic of a specific device is different from another device according to the process to be performed. Even if the same process is performed, the device has a different structure depending on the device manufacturer, and even devices of the same manufacturer are not standardized. If process technology advances from 20 nanometer process to 10 nanometer process, a completely new device is required to be introduced. Although Semiconductor Equipment and Materials International has created SEMI Standards, the entire semiconductor processing device is not yet standardized.

For example, when an additional semiconductor factory is built or a process technology is changed, an etching process chamber designed for an existing process is required to be modified extensively or a new etching process chamber is required to be introduced.

For example, even in the etching process, the compatibility between the etching device of a dielectric thin film and the etching device of a conductive thin film is very low.

On the other hand, in order to expose a chuck unit for maintenance thereof, all the modules connected to the chamber are removed and an operator repairs the chuck unit by inserting a tool from an upper side of the chamber.

SUMMARY OF THE INVENTION

Accordingly, the present invention has been made keeping in mind the above problems occurring in the related art, and the present invention is intended to propose a semiconductor processing device equipped with a standardized process chamber.

The present invention is intended to propose a semiconductor processing device that has compatibility with a semiconductor processing device performing the same process or a similar process, and has scalability so that it can be easily modified to another processing device.

According to the present invention, as a module design concept for standardization is introduced, another process can be immediately performed by replacing only a few modules constituting a semiconductor processing device. For example, when the present invention is adapted to an etching device, an etching device for a dielectric film can be quickly modified to an etching device for a conductor.

According to the present invention, it is also possible to modify an etching device into a deposition device or easily modify the deposition device into various types of deposition devices according to a desired process.

Since the present invention adopts a standardized process chamber, speed and efficiency can be achieved in production, application, maintenance, repair, upgrading, etc. of the device, regardless of a difference of a manufacturer.

In order to achieve the above object, according to one aspect of the present invention, there is provided a semiconductor processing device includes: a chuck unit supporting a substrate; and a process chamber in which the chuck unit is disposed, the process chamber having an inner space in which the substrate is processed.

The process chamber may be divided into a first chamber portion and a second chamber portion on the basis of a division surface. When the first chamber portion and the second chamber portion are closed together at the division surface, the inner space of the process chamber may be closed. When the first chamber portion and the second chamber portion are opened from each other, the inner space of the process chamber and the chuck unit may be exposed to outside.

When the first chamber portion and the second chamber portion are closed together at the division surface, the inner space of the process chamber may be closed. When the first chamber portion and the second chamber portion are opened from each other, the inner space of the process chamber and the chuck unit may be exposed to outside.

The process chamber may include: a substrate entrance provided at one side surface of the process chamber such that the substrate is moved through the substrate entrance; an upper opening portion provided at an upper end of the process chamber, the upper opening portion being connected to an upper unit that provides an energy for processing the substrate; and a lower opening portion provided at a lower end of the process chamber, the lower opening portion being covered with a lower unit which creates a vacuum in the inner space. The division surface may be disposed between any two of the substrate entrance, the upper opening portion, and the lower opening portion.

When defining a virtual three-dimensional Cartesian coordinate system, six faces of the process chamber may be closed along three axial directions and the division surface divides four of the six faces as the first chamber portion and the second chamber portion are closed together.

The division surface may cut the process chamber diagonally when the process chamber is viewed from a side.

The division surface may be configured to be inclined upward from one end of the lower opening portion to an opposite end of the upper opening portion, or to be inclined downward from one end of the upper opening portion to an opposite end of the lower opening portion.

A section between one end of the upper opening portion facing the substrate entrance and the substrate entrance may be defined as a first section. A section between one end of the lower opening portion facing the substrate entrance and the substrate entrance may be defined as a second section. A section between an opposite end of the upper opening portion and an opposite end of the lower opening portion may be defined as a third section. Then, the first chamber portion and the second chamber portion may be configured to be opened from each other on the basis of the imaginary line penetrating the inner space when viewed from the side. One end of the imaginary line may be formed at one section among the first section, the second section, and the third section. An opposite end of the imaginary line may be formed at remaining one of among the first section, the second section, and the third section.

The imaginary line may connect the first section to a lower side of the third section, or the second section to a upper side of the third section.

According to the present invention, a process chamber, which provides an inner space in which a substrate is processed, is realized by coupling two chamber portions. Therefore, when the two chambers are opened from each other, the inside of the process chamber is opened such that a chuck unit disposed in the inner space of the process chamber can be easily maintained.

According to the present invention, the process chamber has a structure in which a part of the chamber is detachable so as to open the inner space of the chamber without removing all the modules connected to the chamber. Therefore, when a part the chamber is slid or rotated, the inner space of the chamber is opened and the chuck unit is exposed to outside whereby the maintenance of the device is simple.

In addition, when only the chuck unit inside the process chamber is replaced, it is possible to modify the processing device to another processing device. A gas supply module, a vacuum module, and the like mounted in any one of the chamber portions is maintained, and the other chamber portion and a chuck unit attached thereto can be replaced to modify the processing device directly into a processing device having a different function.

With the gas supply module and the vacuum module left as they are, the entire process chamber can be easily replaced with another process chamber.

A first chamber portion with the vacuum module is fixed, and a second chamber portion and the chuck unit are replaced together or respectively such that the existing process chamber is easily modified into another processing device.

The present invention achieves standardization since it is possible to modify the processing device into another processing device by merely separating the first chamber portion and the second chamber portion instead of replacing the entire semiconductor processing device.

According to the present invention, since a hinge structure or a sliding structure is adopted when separating the two chamber portions, the two chamber portions can be accurately aligned. The process uniformity for the substrate disposed in the inner space of the process chamber can be improved and the wafer yield can be improved.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinbelow, exemplary embodiments of the present invention will be described in detail with reference to the accompanying drawings. In these drawings, the shapes and sizes of members may be exaggerated for explicit and convenient description. In addition, the terms particularly defined considering functions and operations of the present invention may vary according to intentions or practices of users or operators. Accordingly, the definitions of the terms will be given based on the content throughout the specification.

Figure 1:
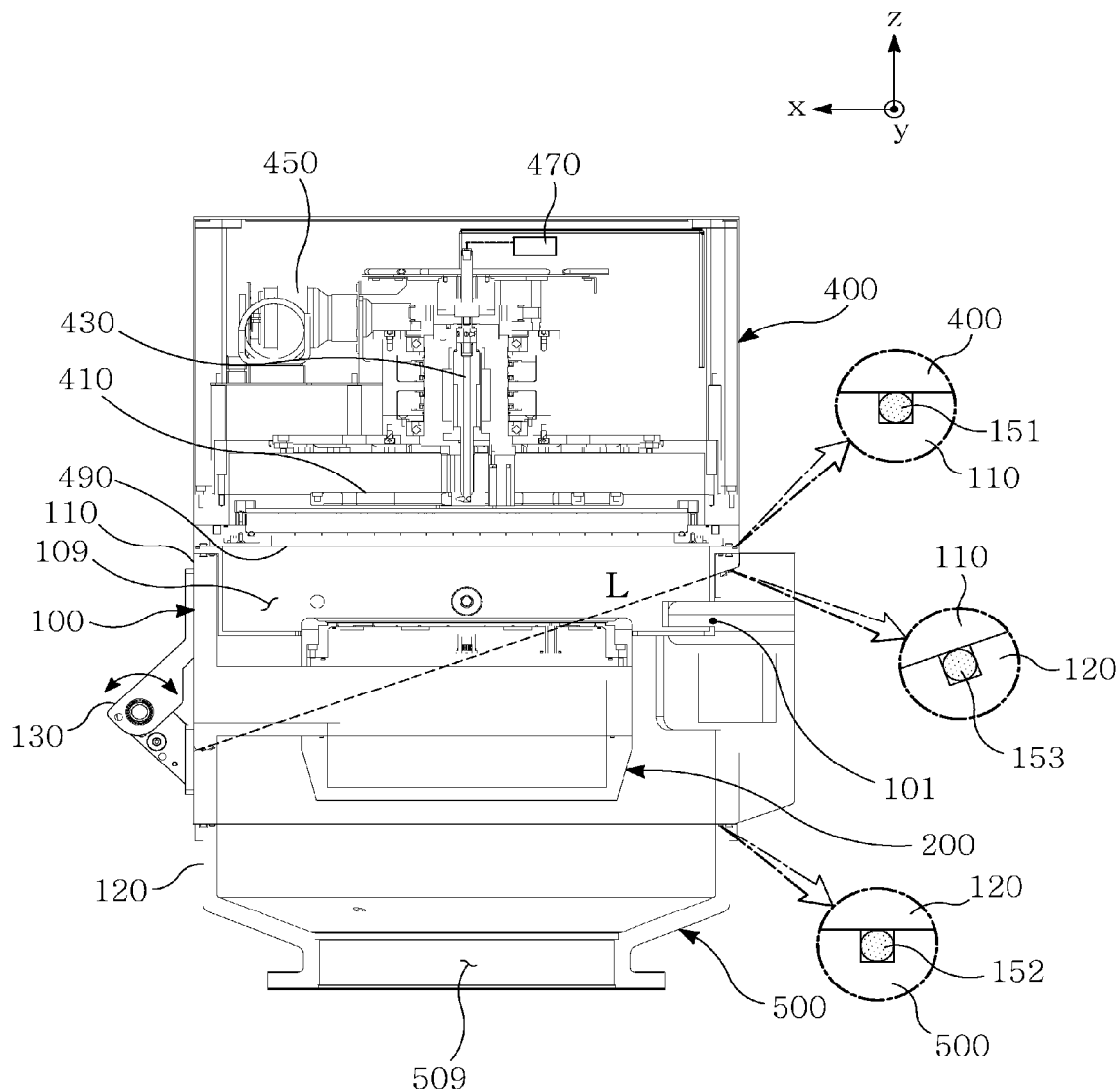
FIG. 1 is a schematic front view showing a semiconductor processing device of the present invention.

FIG. 1 is a schematic front view showing a semiconductor processing device of the present invention.

The semiconductor processing device of the present invention includes a process chamber 100 and a chuck unit 200.

The chuck unit 200 is disposed in an inner space 109 of the process chamber 100. The chuck unit 200 supports a substrate processed by plasma.

The inner space 109 is provided with an upper opening portion 111 on an upper side thereof, the upper opening portion 111 covered by an upper unit 400. The inner space 109 is provided with a lower opening portion 121 on a lower side thereof, the lower opening portion 121 covered by a lower unit 500.

The upper unit 400 is provided with a plasma source, generating plasma in the inner space 109. The plasma source is generated by a capacitively coupled plasma (CCP) type that is a parallel planar shaped plasma type, an inductive coupling plasma (ICP) type in which plasma is induced by an antenna 410, and a helicon plasma type, and so on.

An energy for processing the substrate may be a plasma as an example and generated by the upper unit 400. The energy generated by the upper unit 400 may be any energy such as ion beam and microwave, in addition to the plasma.

As an example, the semiconductor processing device of FIG. 1 may be provided with an ICP type of a plasma source. The plasma source may be provided with the antenna 410.

When high frequency power is applied to the antenna 410, the antenna 410 produces an electromagnetic field, which generates the plasma in the inner space 109.

The upper unit 400 is provided with a cover plate 490 covering the upper opening portion 111 of the inner space 109. The cover plate 490 is interposed between the antenna 410 and the inner space 109. The cover plate 490 covering the upper opening portion 111 provides an upper wall of the inner space 109 in which the plasma is generated. The antenna 410 is disposed at outside, which is separated from the inner space 109 by the cover plate 490. The cover plate 490 may include a dielectric substance such as quartz.

The antenna 410 rotates around a rotary shaft 430 that is perpendicular to the substrate. As an example, the upper unit 400 is provided with the rotary shaft 430 and a motor 450 for rotating the rotary shaft 430 perpendicular to the substrate. When the rotary shaft 430 is rotated by the motor 450, the antenna 410 rotates about the fixed process chamber 100.

The upper unit 400 is provided with a high frequency power supply 470 that generates the high frequency power applied to the antenna 410.

An upper O-ring 151 having a closed-loop shape is interposed between the process chamber 100 and the upper unit 400 to maintain an airtightness of the inner space 109.

The upper unit 400 can be separated from the upper opening portion 111 for maintenance of the process chamber 100 and the chuck unit 200.

Figure 2:
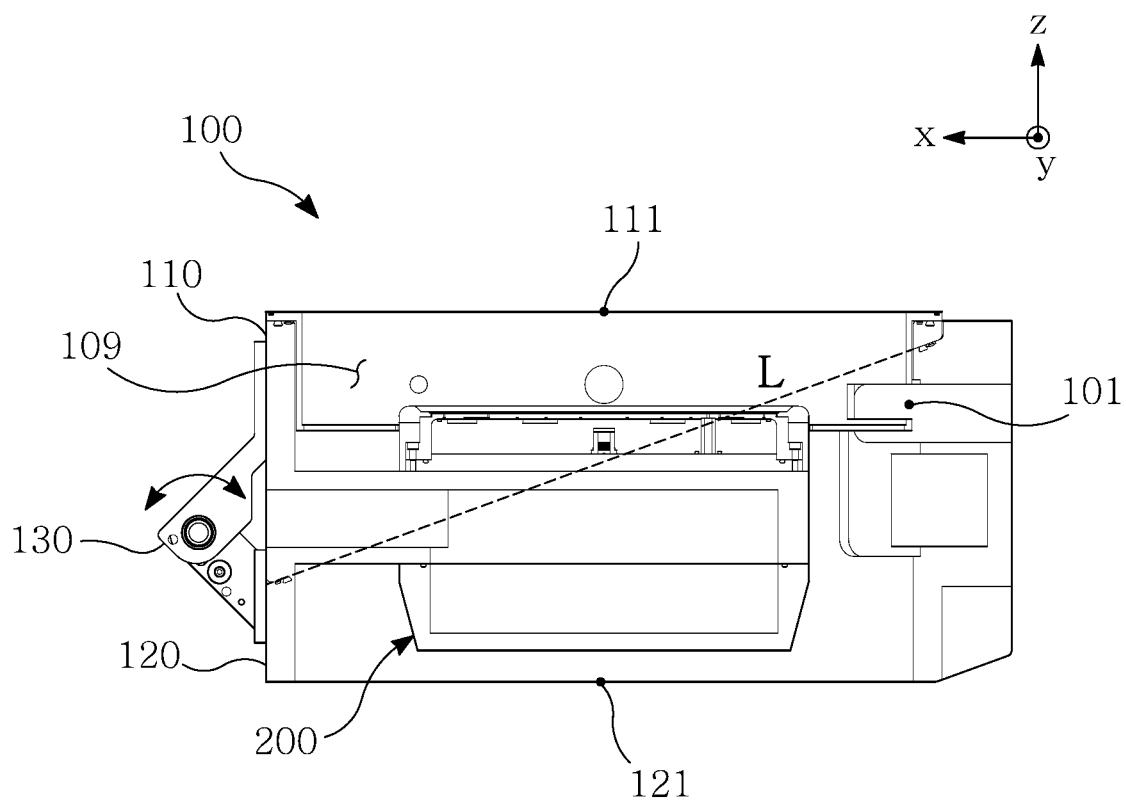
FIG. 2 is a schematic view showing a process chamber of the present invention.

FIG. 2 is a schematic view showing the process chamber 100 of the present invention.

Although the upper unit 400 is separated from the process chamber 100, the chuck unit 200 remains inside the inner space 109. Therefore, it is difficult to secure a sufficient work place for the maintenance of the chuck unit 200 and the inner space 109.

According to the present invention, the process chamber 100 includes a first chamber portion 110 and a second chamber portion 120, which are configured to be opened from each other, to secure the sufficient work place.

The first chamber portion 110 and the second chamber portion 120 are opened from each other or closed together along an imaginary plane or an imaginary line L crossing the inner space 109. Therefore, the inner space 109 where the substrate is processed is formed as the first chamber portion 110 and the second chamber portion 120 are closed together. When the first chamber portion 110 and the second chamber portion 120 are opened from each other, the inner space 109 is opened such that the chuck unit 200 is exposed to outside. Therefore, when the first chamber portion 110 and the second chamber portion 120 are opened from each other, a sufficient work place for the maintenance of the inner space 109 and the chuck unit 200 is realized.

When the first chamber portion 110 and second chamber portion 120 are opened from each other, it is preferable that any one of the chamber portions is fixed and a remaining chamber portion is movable. This is because the process chamber 100 is connected to a transfer chamber 300 provided with a transfer robot 310. Thus, in the case the second chamber portion 120 is connected to the transfer chamber 300, it is preferable that the second chamber portion 120 is fixed and a separation thereof is determined by a movement of the first chamber portion 110. At this point, the chuck unit 200 is connected to the first chamber portion 110.

When the first chamber portion 110 and the second chamber portion 120 are opened from each other, the chuck unit 200 moves with the first chamber portion 110. Accordingly, the chuck unit 200 is removed from the process chamber 100.

A cutting plane of the process chamber 100 corresponding to a division surface 125 of the first chamber portion 110 and the second chamber portion 120 is configured not to cut a substrate entrance 101, the upper opening portion 111, and the lower opening portion 121. This is because if the substrate entrance 101, the upper opening portion 111, the lower opening portion 121 are cut, it is difficult to maintain the airtightness of the inner space 109 when the first chamber portion 110 and the second chamber portion 120 are closed together. The cutting plane of the process chamber 100 is preferably determined to maintain the airtightness of the inner space 109.

The first chamber portion 110 and the second chamber portion 120 are configured to be opened from each other on the basis of the imaginary line L dividing the inner space 109 when viewed from a side.

The imaginary line is a diagonal line extending from between an upper end of the substrate entrance 101 and the upper opening portion 111 to an opposite side surface of the inner space 109. In detail, one end of the substrate entrance 101 of the imaginary line may be provided above the center of the chuck unit 200, and an opposite end of the imaginary line may be provided below the center of the chuck unit 200. According to the imaginary line, when the substrate entrance 101 is provided on the second chamber portion 120, the process chamber 100 is cut without damages of the substrate entrance 101, the upper opening portion 111, and the lower opening portion 121.

In addition, when the first chamber portion 110 moves with respect to the second chamber portion 120 in which a position thereof is fixed due to the substrate entrance 101, the first chamber portion 110 provides an enough space for connecting the chuck unit 200 therewith. According to the present invention, half or more than half of the process chamber 100 or the inner space 109 provides the space for the first chamber portion 110. Thus, the chuck unit 200 provided with various components is connected to the first chamber portion 110 easily. The chuck unit 200 is connected with a cooling pipe in which cooling water flows, a gas pipe in which heat conductive gas flows, a first wire through which direct current power flows, a second wire through which the high frequency power flows, and so on. The first chamber portion 110 and the chuck unit 200 are connected with each other by a pipe-shaped connecting portion 170. The cooling pipe, the gas pipe, the first wire, the second wire, etc. are disposed inside the connecting portion 170.

In related art, the connecting portion 170 is only a passage for reaching to the chuck unit 200 and a position of the connecting portion 170 is fixed whereby it is inevitable to put tools into the connecting portion 170 for the maintenance. However, the chuck unit 200 can be exposed to outside in the related art, whereby the chuck unit 200 can be repaired without passing through the connecting portion 170. In addition, the connecting portion 170 can be moved by rotating or sliding the first chamber portion 110 such that the maintenance is facilitated at a position that can be easily accessed by a worker.

The second chamber portion 120 is fixed with respect to the transfer robot 310. The first chamber portion 110 is configured to be movable with respect to the second chamber portion 120. As the first chamber portion 110 moves and then is closed to the second chamber portion 120, the chuck unit 200 connected to the first chamber portion 110 is arranged on a predetermined position with respect to the upper unit 400 or the substrate entrance 101.

Meanwhile, the predetermined position of the chuck unit 200 with respect to the upper unit 400 or the substrate entrance 101 may deviate from the initial predetermined position when the first chamber portion 110 and the second chamber portion 120 are closed together. If the predetermined position deviates, it is hard to perform a plasma process (etching, washing, deposition) on the substrate uniformly.

It is required to arrange the first chamber portion 110 and the second chamber portion 120 mutually to dispose the position of the chuck unit 200 to the initial predetermined position. As a length or an area of the division surface 125 is longer or larger when two opened components are closed together, the two components are arranged more accurately. According to the present invention, the imaginary line L corresponding to the division surface 125 between the first chamber portion 110 and the second chamber portion 120 is configured to be a diagonal line. As the length of the imaginary line L becomes maximized, the alignment accuracy between the first chamber portion 110 and the second chamber portion 120 is improved when coupled and the chuck unit 200 can be disposed at the initial predetermined position.

When the first chamber portion 110 and the second chamber portion 120 are opened from each other, an inner periphery of the division surface 125 defines a closed curve. The closed curve may be a circle or an ellipse. In addition, an airtight means closing the clearance of the division surface 125 may be configured as a circle ring or an elliptic ring. A chamber O-ring 153 is an example of the airtight means interposed between the first chamber portion 110 and the second chamber portion 120.

Figure 3:
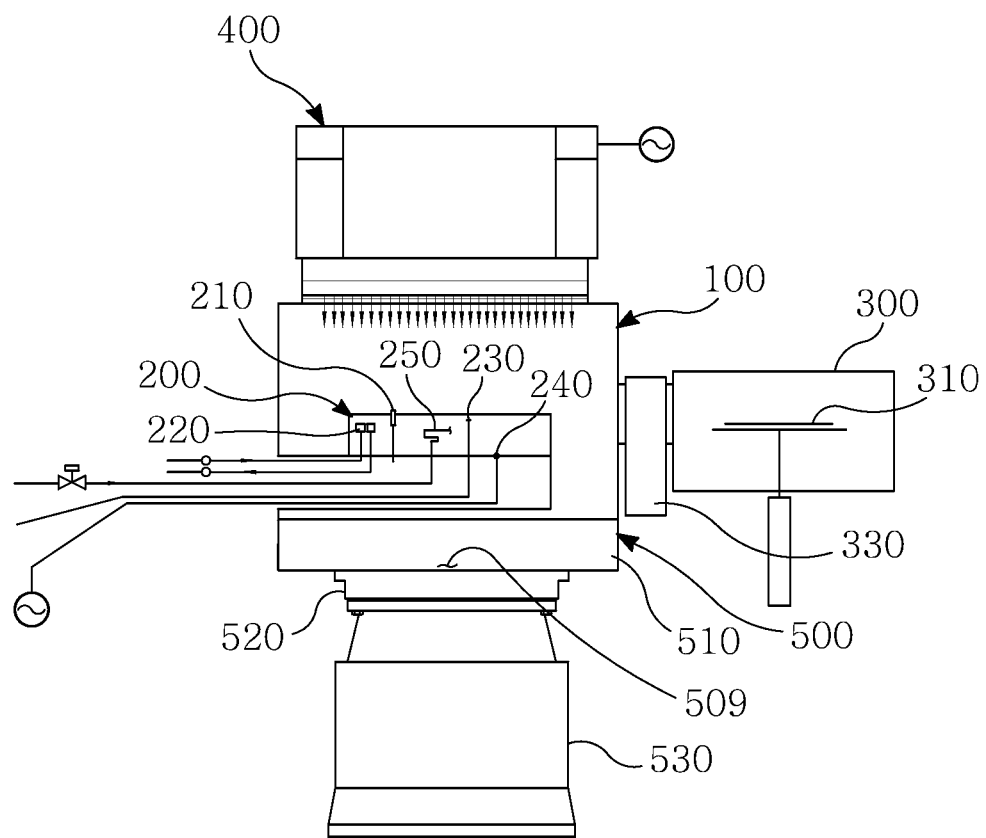
FIG. 3 is a schematic side view showing a semiconductor processing device of the present invention.

FIG. 3 is a schematic side view showing the semiconductor processing device of the present invention.

The lower unit 500 covering the lower opening portion 121 of the inner space 109 creates a vacuum in the inner space 109 of the process chamber 100. The lower unit 500 is provided with a discharging portion discharging gas inside the inner space 109 to outside.

As an example, the discharging portion is provided with a pump 530 pumping the gas inside the inner space 109 to discharge to outside and an exhaust valve 520 interposed between the pump 530 and the inner space 109 and opening and closing a gas pipe. A connection pipe 510 is interposed between the exhaust valve 520 and the inner space 109. The connection pipe 510 is provided with a discharge port 509 for gas.

The transfer chamber 300 is provided at a side of the process chamber 100. The transfer chamber 300 is provided with the transfer robot 310 transferring the substrate. A gate valve 330 is interposed between the process chamber 100 and the transfer chamber 300, the gate valve 330 opening and closing the substrate entrance 101 of the inner space 109.

The chuck unit 200 is provided with an elevating pin 210, a cooling pipe 220, and a heat conductive gas pipe 250. The elevating pin 210 raises the substrate. When the substrate is supported by the elevating pin 210, the transfer robot 310 moves to the transfer chamber 300.

A coolant flowing in the cooling pipe 220 cools the chuck unit 200 heated by the plasma process. The heat conductive gas pipe 250 supplies a heat conductive gas such as helium between one surface of the chuck unit 200 and the substrate.

The chuck unit 200 is provided with a direct current electrode 230 applying a direct current power or a high frequency electrode 240 applying a high frequency power. The direct current electrode 230 induces an attractive force to attract the substrate toward the chuck unit 200. The high frequency electrode 240 induces the plasma in the inner space 109.

Since the chuck unit 200 has a complicated structure provided with the elevating pin 210, the cooling pipe 220, the heat conductive gas pipe 250, the direct current electrode 230, the high frequency electrode 240, and so on, maintenance of the chuck unit 200 is obligatorily.

According to the present invention, the inner space 109 where the chuck unit 200 is disposed is split in multiple numbers, maintenance of the chuck unit 200 is easily facilitated.

Figure 4:
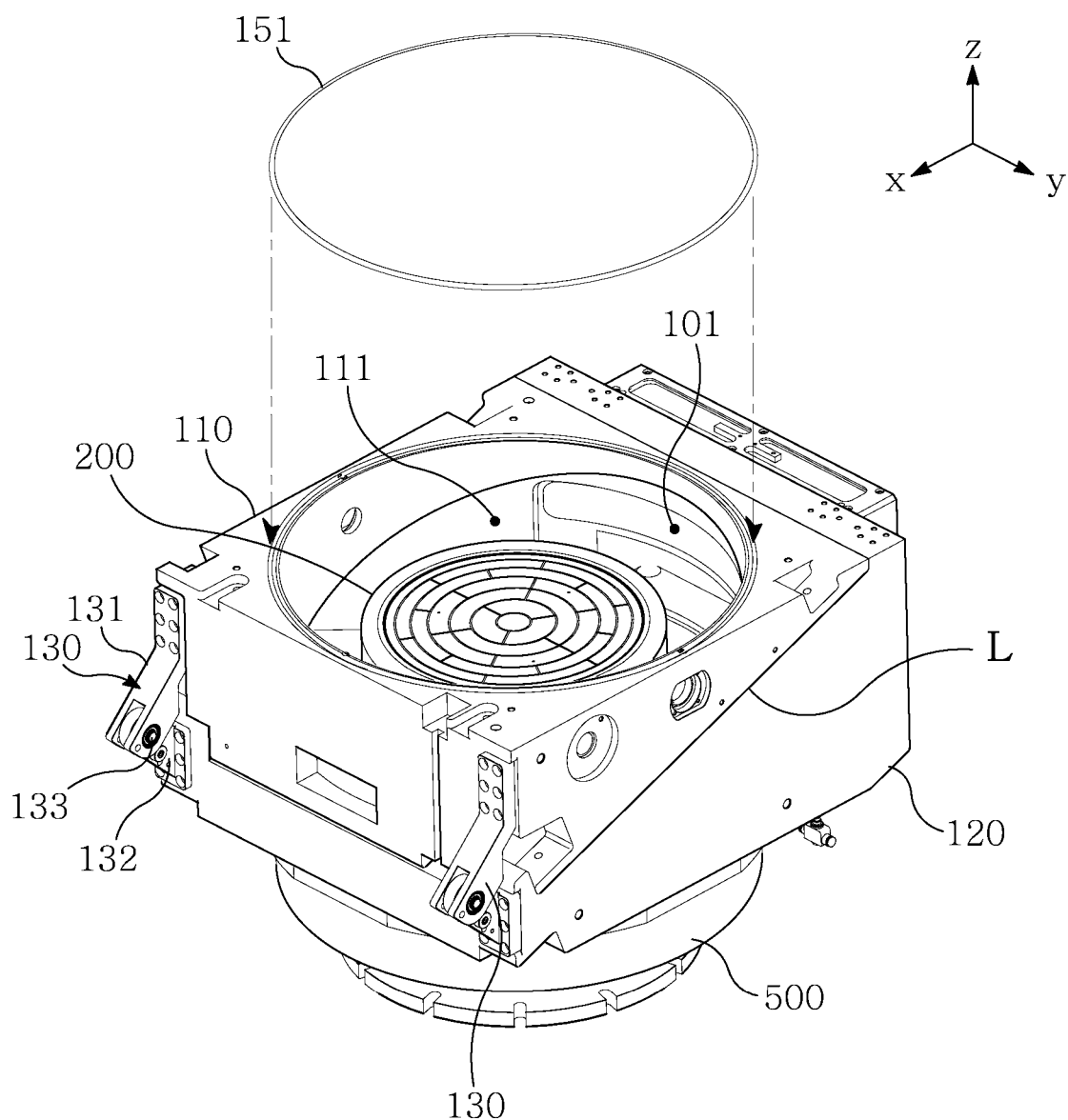
FIG. 4 is a perspective view showing a process chamber of the present invention.
Figure 5:
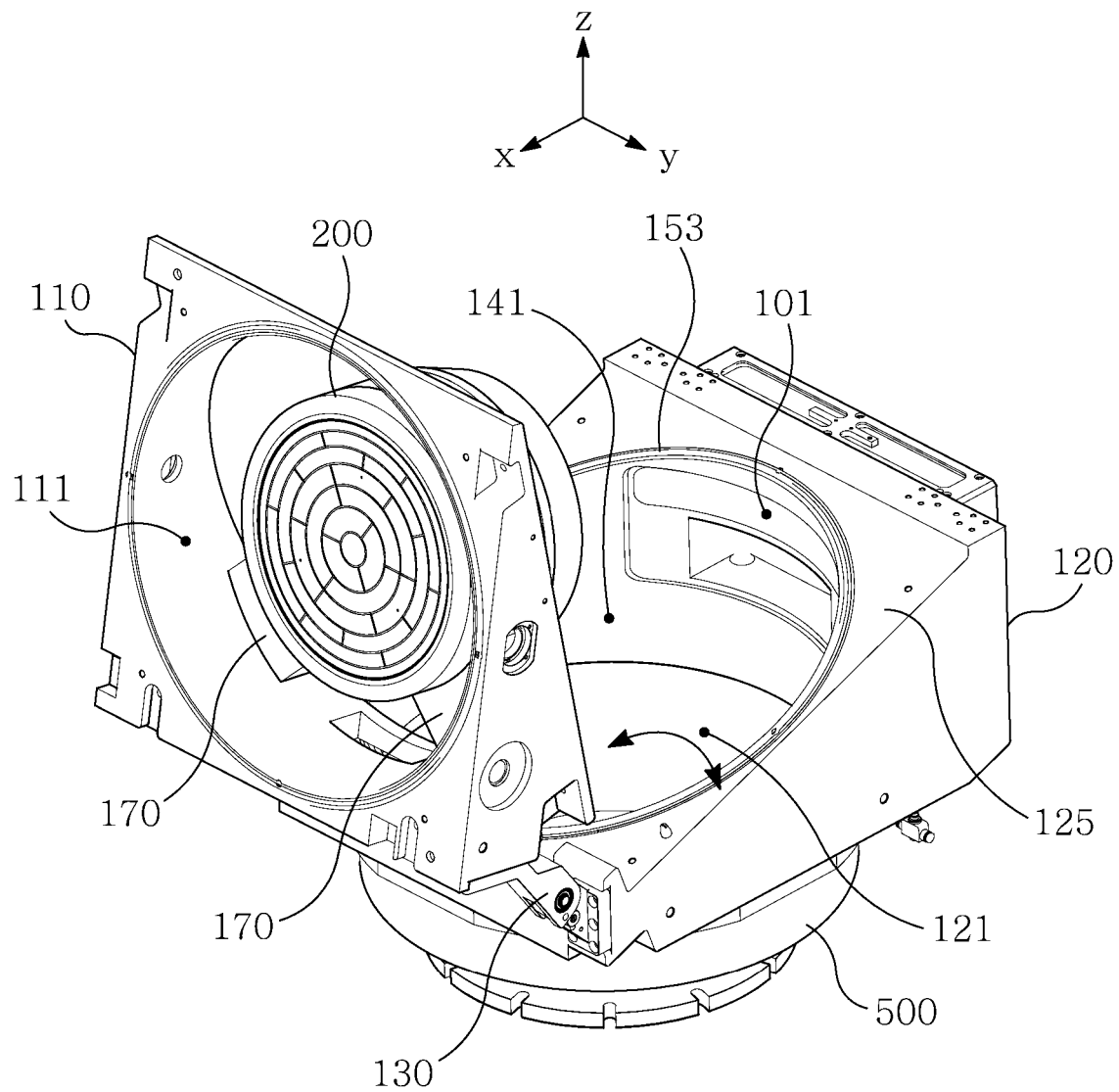
FIG. 5 is another perspective view showing a process chamber of the present invention.

FIG. 4 is a perspective view showing the process chamber 100 of the present invention, and FIG. 5 is another perspective view showing the process chamber 100 of the present invention.

The first chamber portion 110 is configured to move linearly or rotate with respect to the second chamber portion 120.

As an example, a hinge portion 130 is provided to connect the first chamber portion 110 and the second chamber portion 120 together. The hinge portion 130 includes a first hinge means 131, a second hinge means 132, and a rotary shaft 133. An end of the first hinge means 131 connects to the first chamber portion 110 and an end of the second hinge means 132 connects to the second chamber portion 120.

The rotary shaft 133 connects another end of the first hinge means 131 to another end of the second hinge means 132, and becomes a central axis of the first hinge means 131 and the second hinge means 132. The first chamber portion 110 and the second chamber portion 120 connected with each hinge means rotate about the rotary shaft 133 as the central axis.

The first chamber portion 110 rotates within a predetermined angle range to easily facilitate the maintenance of the chuck unit 200 moving with the first chamber portion 110.

As an example, the first chamber portion 110 rotates within an angle range in which a supporting surface of the chuck unit 200 for the substrate faces a side surface of the process chamber 100 as shown in FIG. 5. The supporting surface of the chuck unit 200 for the substrate may correspond to an upper surface of the chuck unit 200 when the chuck unit 200 is disposed inside the inner space 109.

It is preferable that the supporting surface of the chuck unit 200 is maintained at an angle of 80 to 80 degrees based on the ground surface, for ease of the operation. Therefore, it is preferable that a maximum rotation angle range of the first chamber portion 110 is also determined within the range of 80 to 90 degrees.

The inner space 109 is required to maintain the airtightness thereof when the first chamber portion 110 and the second chamber portion 120 are closed together. Thus, it is important how the process chamber 100 is cut to form the first chamber portion 110 and the second chamber portion 120 for maintaining the airtightness of the inner space 109.

The upper O-ring 151 is interposed between the first chamber portion 110 and the upper unit 400, the upper O-ring 151 having the closed-loop shape and closing the upper opening portion 111. The upper O-ring 151 is an important component to close the upper opening portion 111 of the inner space 109, so the upper O-ring 151 should not be cut. Therefore, the upper O-ring 151 preferably maintains the original closed-loop shape thereof. A lower O-ring 152 is also an important component to isolate the lower opening portion 121 of the inner space 109 from outside, so the closed-loop shape is preferable.

Assuming the imaginary line L crossing between the upper O-ring 151 and the lower O-ring 152, the first chamber portion 110 and the second chamber portion 120 are configured to separate from each other on the basis of the imaginary line L when viewed from the side. As shown in FIG. 2, when the first chamber portion 110 and the second chamber portion 120 are opened from each other along the imaginary line L crossing between the upper O-ring 151 and the lower O-ring 152, the upper O-ring 151 and the lower O-ring 152 can be maintained intact.

Meanwhile, the inner space 109 may be configured with the substrate entrance 101 at one side surface thereof, the inner space 109 through which the transfer robot 310 carrying the substrate moves. Here, if the substrate entrance 101 is divided into a plurality of parts, it may become difficult to maintain the airtightness. Therefore, the substrate entrance 101 is also preferably maintained intact without regard to the separation of the first chamber portion 110 and the second chamber portion 120.

Figure 6:
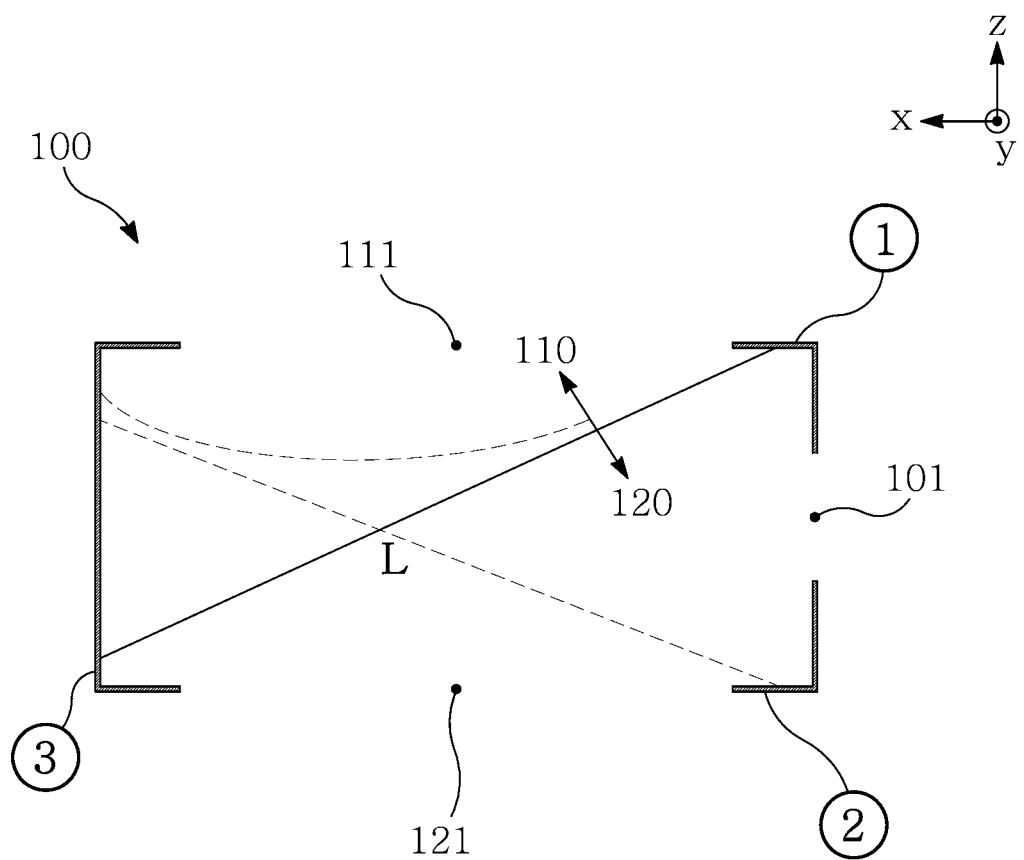
FIG. 6 is a schematic view showing a cutting line of a process chamber of the present invention.

FIG. 6 is a schematic view showing a cutting line of the process chamber 100.

In the process chamber 100, a section between one end of the upper opening portion 111 facing the substrate entrance 101 and the substrate entrance 101 is defined as a first section ①.

In the process chamber 100, a section between one end of the lower opening portion 121 facing the substrate entrance 101 and the substrate entrance 101 is defined as a second section ②.

In the process chamber 100, a section between an opposite end of the upper opening portion 111 and an opposite end of the lower opening portion 121 is defined as a third section ③.

The first chamber portion 110 and the second chamber portion 120 are configured to be opened from each other on the basis of the imaginary line L penetrating the inner space 109 when viewed from the side.

As an example, one end of the imaginary line L may be formed at one section among the first section ①, the second section ②, and the third section ③. An opposite end of the imaginary line L may be formed at a remaining one of among the first section ①, the second section ②, and the third section ③.

According to the embodiment, the imaginary line L is configured to avoid the upper O-ring 151 closing the upper opening portion 111, the lower O-ring 152 closing the lower opening portion 121, and the substrate entrance 101. Thus, the upper O-ring 151, the lower O-ring 152, and the substrate entrance 101 can be maintained intact. The chamber O-ring 153 interposed between the first chamber portion 110 and the second chamber portion 120 ensures the airtightness of the inner space 109.

When the first chamber portion 110 and the second chamber portion 120 are closed together, the longer imaginary line L is preferable for the alignment of the chuck unit 200. The imaginary line L may be configured as a curve to increase the length thereof.

The imaginary line L preferably crosses between the first section ① and a lower portion of the third section ③, or between the second section ② and an upper portion of the third section ③ to increase the length thereof. The lower portion of the third section ③ may be lower than the center of the third section ③ in the direction of gravity. The upper portion of the third section ③ may be above the center of the third section ③ in the direction of gravity.

Based on the imaginary line L, the upper portion of the process chamber 100 may serve as the first chamber portion 110, and the lower portion of the process chamber 100 may serve as the second chamber portion 120.

Figure 7:
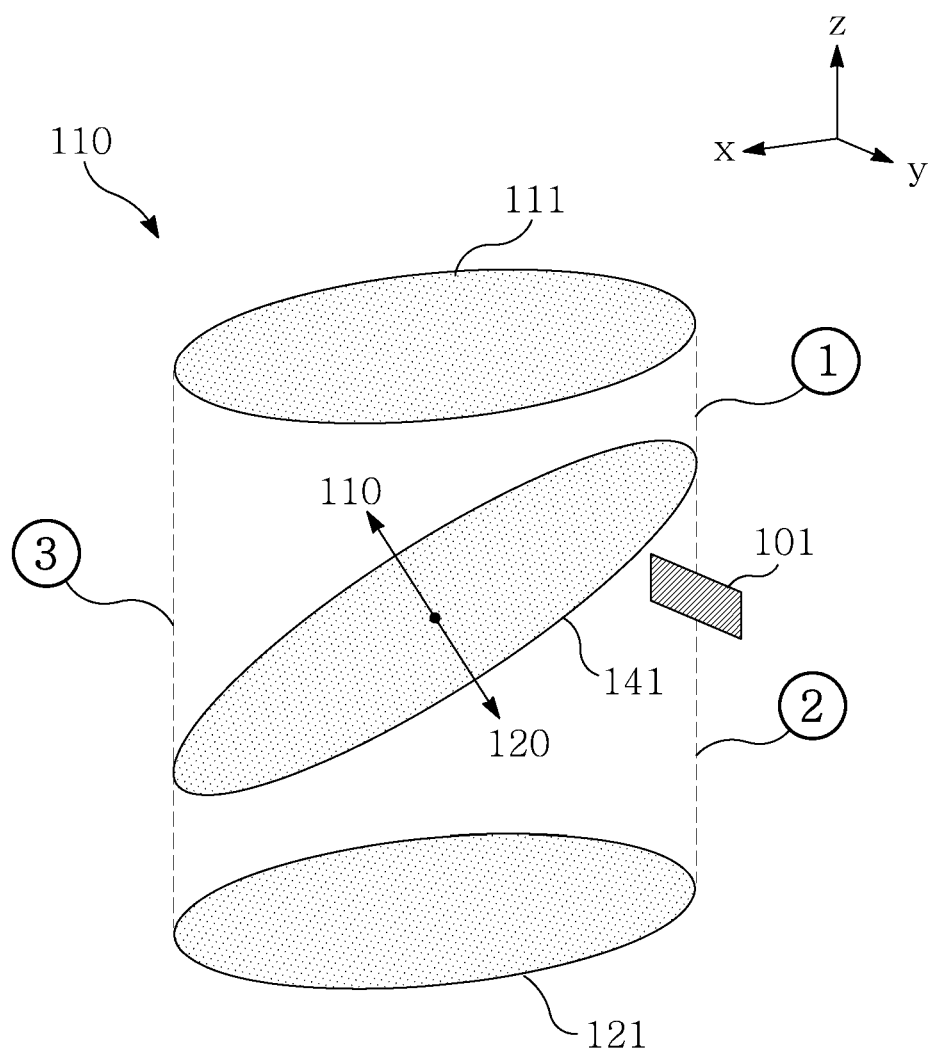
FIG. 7 is a schematic view showing opening portions provided on a process chamber of the present invention.

FIG. 7 is a schematic view showing opening portions provided on the process chamber 100.

According to the present invention, the inner space 109 in the process chamber 100 is provided with four opening portions. An opening portion connected to an outer pipe to make the inner space 109 vacuum, and the like are excluded.

The four opening portions includes the substrate entrance 101, the upper opening portion 111, and the lower opening portion 121. A remaining one opening portion may include a chamber opening portion 141 provided on the division surface 125 of the first chamber portion 110 and the second chamber portion 120. The chamber opening portion 141 corresponds to the cutting plane of the inner space 109.

The chamber opening portion 141 may be configured to maintain the upper O-ring 151, the lower O-ring 152, and the substrate entrance 101 intact without regard to the separation and coupling of the first chamber portion 110 and the second chamber portion 120.

As an example, one end of the chamber opening portion 141 may be formed at one section among the first section ①, the second section ②, and the third section ③. An opposite end of the chamber opening portion 141 may be formed at a remaining one of among the first section ①, the second section ②, and the third section ③.

The chamber opening portion 141 according to the present embodiment is configured to avoid the upper O-ring 151, the lower O-ring 152, and the substrate entrance 101 whereby the airtightness of the inner space 109 is ensured when the first chamber portion 110 and the second chamber portion 120 are closed together.

Although the preferred embodiments of the present invention have been described for illustrative purposes, those skilled in the art will appreciate that various modifications, additions and substitutions are possible. It is thus well known to those skilled in that art that the present invention is not limited to the embodiment disclosed in the detailed description, and the patent right of the present invention should be defined by the scope and spirit of the invention as disclosed in the accompanying claims.

What is claimed is:

1. A semiconductor processing device comprising: a chuck unit for supporting a substrate; and a process chamber in which the chuck unit is disposed, the process chamber having an inner space in which the substrate is processed, wherein the process chamber is divided into a first chamber portion being an upper chamber portion and a second chamber portion being a lower chamber portion on the basis of a division surface; when the first chamber portion and the second chamber portion are closed together at the division surface, the inner space of the process chamber is closed; and when the first chamber portion and the second chamber portion are opened from each other, the inner space of the process chamber and the chuck unit are exposed to outside. a hinge portion provided to connect the first chamber portion and the second chamber portion together, the first chamber portion is configured to rotate about the hinge portion relative to the second chamber portion, and the chuck unit is connected to the first chamber portion, and the chuck unit is configured to rotate with the first chamber portion, relative to the second chamber portion; and a transfer chamber connected to the second chamber portion, the transfer chamber having a transfer robot.

2. The device of claim 1, wherein the process chamber includes:
   a substrate entrance provided at one side surface of the process chamber such that the substrate is moved through the substrate entrance;
   an upper opening portion provided at an upper end of the process chamber, the upper opening portion being connected to an upper unit that provides an energy for processing the substrate; and a lower opening portion provided at a lower end of the process chamber, the lower opening portion being covered with a lower unit which creates a vacuum in the inner space, and the division surface is disposed between any two of the substrate entrance, the upper opening portion, and the lower opening portion.

3. The device of claim 1, wherein the process chamber includes:

a substrate entrance provided at one side surface of the process chamber such that the substrate is moved through the substrate entrance, an upper opening portion provided at an upper end of the process chamber, the upper opening portion being connected to an upper unit that provides an energy for processing the substrate, and a lower opening portion provided at a lower end of the process chamber, the lower opening portion being covered with a lower unit that creates a vacuum in the inner space, and the division surface is provided at a position avoiding the substrate entrance, the upper opening portion, and the lower opening portion.

4. The device of claim 1, wherein when defining a virtual three-dimensional Cartesian coordinate system, six faces of the process chamber are closed along three axial directions and the division surface divides four of the six faces as the first chamber portion and the second chamber portion are closed together.

5. The device of claims 1, wherein the division surface cuts the process chamber diagonally when the process chamber is viewed from a side.

6. The device of claim 1, wherein the process chamber includes:

an upper opening portion provided at an upper end of the process chamber, the upper opening portion being connected to an upper unit that provides an energy for processing the substrate, and a lower opening portion provided at a lower end of the process chamber, the lower opening portion being covered with a lower unit that creates a vacuum in the inner space, and the division surface is configured to be inclined upward from one end of the lower opening portion to an opposite end of the upper opening portion, or to be inclined downward from one end of the upper opening portion to an opposite end of the lower opening portion.

7. The device of claim 1, wherein the second chamber portion is provided with a substrate entrance through which the substrate is moved, the chuck unit is connected to the first chamber portion, and the second chamber portion is in a fixed position and the chuck unit is moved with the first chamber portion when the process chamber is opened.

8. The device of claim 1, wherein, when the first chamber portion and the second chamber portion are opened from each other, an inner periphery of the division surface defines a closed curve which is a circle or an ellipse, and the division surface is closed by an airtight means that is configured as a circle ring or an elliptic ring.

9. The device of claim 1, wherein a substrate entrance is provided at one side of the inner space such that the transfer robot carrying the substrate moves through the substrate entrance, an upper opening portion is provided at an upper end of the inner space, the upper opening portion being covered with an upper unit provided with a plasma source, the first chamber portion and the second chamber portion are configured to be opened from each other on the basis of an imaginary line dividing the inner space when viewed from a side, and the imaginary line includes a diagonal line extending from between an upper end of the substrate entrance and the upper opening portion to an opposite side of the inner space.

10. The device of claim 1, wherein the chuck unit is connected to the first chamber portion, and when the first chamber portion is rotated, the inner space of the process chamber is opened and a substrate supporting surface of the chuck unit rotates to face a side surface of the process chamber.

11. The device of claim 1, wherein the chuck unit is connected to the first chamber portion, the second chamber portion is provided with a substrate entrance at one side surface thereof such that the transfer robot carrying the substrate moves through the substrate entrance, the second chamber portion is fixed with respect to the transfer robot, the first chamber portion is configured to be movable with respect to the second chamber portion, and as the first chamber portion moves and then is closed to the second chamber portion, the chuck unit connected to the first chamber portion is arranged on a predetermined position with respect to the substrate entrance.

12. The device of claim 1, wherein an upper opening portion is provided at an upper side of the inner space, the upper opening portion being covered with an upper unit provided with a plasma source, a lower opening portion is provided at a lower side of the inner space, the lower opening portion being covered with a lower unit, an upper O-ring is interposed between the first chamber portion and the upper unit, the upper O-ring having a closed-loop shape and closing the upper opening portion, a lower O-ring is interposed between the second chamber portion and the lower unit, the lower O-ring having a closed-loop shape and closing the lower opening portion, and the first chamber portion and the second chamber portion are configured to be opened from each other on the basis of an imaginary line crossing between the upper O-ring and the lower O-ring.

13. The device of claim 1, wherein the division surface is configured to be capable of maintaining an inclined state based on a ground surface by the rotation of the first chamber portion relative to the second chamber portion.

* * * * *